US008650006B2

(12) United States Patent
Prevost et al.

(10) Patent No.: US 8,650,006 B2
(45) Date of Patent: Feb. 11, 2014

(54) METHODS OF DESIGNING EARTH-BORING TOOLS USING A PLURALITY OF DEPTH OF CUT VALUES AND RELATED METHODS OF FORMING EARTH-BORING TOOLS

(75) Inventors: Gregory C. Prevost, Spring, TX (US); Lance A. Endres, Spring, TX (US); Tyler R. Reynolds, The Woodlands, TX (US)

(73) Assignee: Baker Hughes Incorporated, Houston, TX (US)

( * ) Notice: Subject to any disclaimer, the term of this patent is extended or adjusted under 35 U.S.C. 154(b) by 193 days.

(21) Appl. No.: 13/204,422

(22) Filed: Aug. 5, 2011

(65) Prior Publication Data

US 2013/0035903 A1    Feb. 7, 2013

(51) Int. Cl.
*G06F 17/50* (2006.01)
(52) U.S. Cl.
USPC ............................................................ 703/1
(58) Field of Classification Search
USPC ............................................................ 703/1
See application file for complete search history.

(56) References Cited

U.S. PATENT DOCUMENTS

| | | | |
|---|---|---|---|
| 3,491,844 A | 1/1970 | Kelly, Jr. | |
| 5,042,596 A | 8/1991 | Brett et al. | |
| 5,605,198 A * | 2/1997 | Tibbitts et al. | 175/432 |
| 6,516,293 B1 | 2/2003 | Huang et al. | |
| 6,619,411 B2 | 9/2003 | Singh et al. | |
| 6,879,947 B1 | 4/2005 | Glass | |
| 7,302,374 B2 | 11/2007 | Singh et al. | |
| 7,693,695 B2 | 4/2010 | Huang et al. | |
| 7,860,696 B2 | 12/2010 | Chen | |
| 7,899,658 B2 | 3/2011 | Oliver et al. | |
| 2004/0104053 A1 | 6/2004 | Chen | |
| 2005/0133272 A1* | 6/2005 | Huang et al. | 175/327 |
| 2005/0165592 A1* | 7/2005 | Huang | 703/7 |
| 2006/0167669 A1* | 7/2006 | Cariveau et al. | 703/7 |
| 2007/0093996 A1* | 4/2007 | Cariveau et al. | 703/7 |
| 2009/0055135 A1* | 2/2009 | Tang et al. | 703/1 |
| 2009/0166091 A1* | 7/2009 | Matthews et al. | 175/195 |
| 2011/0083906 A1* | 4/2011 | Hall et al. | 175/378 |

OTHER PUBLICATIONS

Hanson et al., "Dynamics Modeling of PDC Bits," 1995 SPE/IADC Drilling Conference, Amsterdam (1995) pp. 589-604.
Dykstra et al., "Improving Drilling Performance by Applying Advanced Dynamics Models," 2001 SPE/IADC Drilling Conference, Amsterdam (2001) pp. 1-18.

* cited by examiner

*Primary Examiner* — Dwin M Craig
*Assistant Examiner* — Russ Guill
(74) *Attorney, Agent, or Firm* — TraskBritt (57) ABSTRACT

Methods of designing an earth-boring tool are described, including calculating one or more performance parameters of the tool based on drilling conditions, a plurality of depth of cut values, and a set of values of other design variables. Methods of enhancing a performance parameter in the design of an earth-boring tool are also described, including calculating the performance parameter based at least partially on a plurality of depth of cut values and a first set of values of other design variables, calculating the performance parameter based at least partially on a second set of values of the other design variables different than the first set, and comparing the calculated performance parameters to determine which of the first and the second set is closer to a target range or value across a range of the plurality of depths of cut. Related methods of forming an earth-boring tool are also described.

15 Claims, 6 Drawing Sheets

FIG. 6 even though they may be referred to as illustrations of embodiments of the present disclosure.

METHODS OF DESIGNING EARTH-BORING TOOLS USING A PLURALITY OF DEPTH OF CUT VALUES AND RELATED METHODS OF FORMING EARTH-BORING TOOLS

TECHNICAL FIELD

Embodiments of the present disclosure relate generally to methods of designing earth-boring tools for drilling subterranean formations, such as drill bits. Some embodiments relate to methods of designing earth-boring tools including enhancing one or more performance parameters of earth-boring tools using a plurality of depth of cut values of the earth-boring tools. Some embodiments of the disclosure also relate to methods of forming earth-boring tools for drilling subterranean formations including designing the earth-boring tools using a plurality of depth of cut values of the earth-boring tools.

BACKGROUND

Wellbores are formed in subterranean formations for various purposes including, for example, the extraction of oil and gas from a subterranean formation and the extraction of geothermal heat from a subterranean formation. A wellbore may be formed in a subterranean formation using a drill bit, such as, for example, an earth-boring rotary drill bit. Different types of earth-boring rotary drill bits are known in the art, including, for example, fixed-cutter bits (which are often referred to in the art as "drag" bits), rolling-cutter bits (which are often referred to in the art as "rock" bits), impregnated bits (impregnated with diamonds or other abrasive particles), and hybrid bits (which may include, for example, both fixed cutters and rolling cutters).

An earth-boring drill bit is typically mounted on the lower end of a drill string and is rotated by rotating the drill string at the surface or by actuation of downhole motors or turbines, or by both methods. The drill string comprises a series of elongated tubular segments connected end-to-end that extends into the wellbore from the surface of the formation. When weight or other axial force is applied to the drill string and consequently to the drill bit, the rotating bit engages the formation and proceeds to form a wellbore. The weight or other force used to push the drill bit into and against the formation is often referred to as the "weight-on-bit" (WOB). As the drill bit rotates, the cutters or abrasive structures thereof cut, crush, shear, and/or abrade away the formation material to form the wellbore. The rate at which the drill bit proceeds into the formation is often referred to as the "rate of penetration" (ROP). With each revolution of the drill bit, the drill bit proceeds into the formation a distance, often referred to as the "depth of cut" (DOC). The ROP and DOC may be related to the type of drill bit used, the WOB, the rate at which the drill bit rotates (i.e., the "revolutions per minute" (RPM)), the number of cutters or abrasive particles on the drill bit, the location or arrangement of the cutters or abrasive particles on the drill bit, the hardness of the formation material, etc.

Figure 1A:
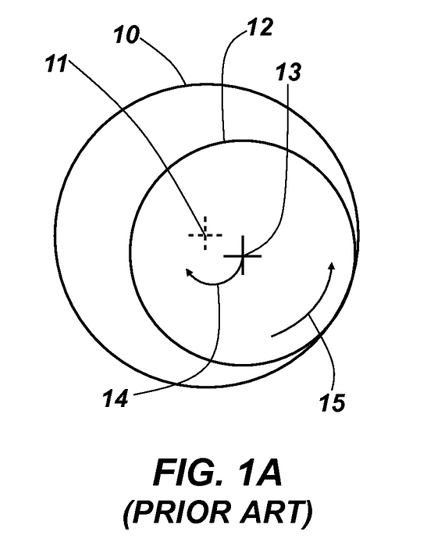
FIGS. 1A and 1B are bottom views of a prior art earth-boring drill bit in a wellbore experiencing backwards whirl and forward synchronous rotation, respectively.
Figure 1B:
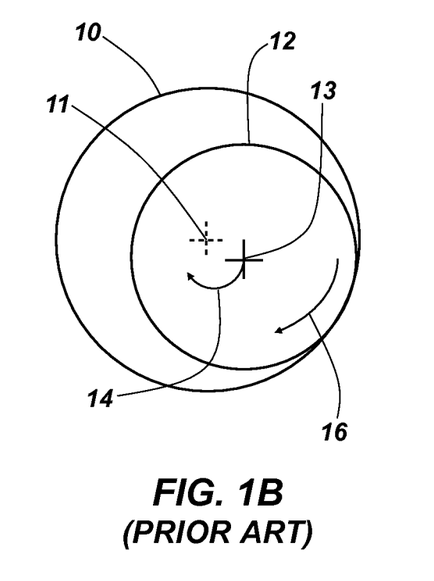

During drilling of a formation, drill bits may wear down and become damaged, causing them to be less effective at drilling and maintaining a desirable (i.e., high) ROP. Lateral vibrations during drilling may cause a drill bit to rotate about, but offset from, the center of a borehole in an unstable fashion. This rotation about the center of the borehole is often referred to as "bit whirl" or "backwards whirl," terms often used to describe a drill bit rotating about the center of a borehole in an opposite direction as the rotation of the drill bit and drill string as a whole. For example, FIG. 1A illustrates a borehole 10 with a drill bit 12 inside the borehole 10 experiencing backwards whirl. The drill bit 12 is rotating about its axis 13 in a counter clockwise direction 15. However, the drill bit 12 as a whole rotates about an axis 11 of the borehole 10 in a clockwise direction 14. Such backwards whirl can damage cutters and cause premature wear of drill bits. "Forward synchronous rotation" of a drill bit, which is a term used to describe rotation of the drill bit about a center of a borehole in the same direction as the rotation of the drill bit and drill string as a whole, typically causes less damage and wear to drill bits when compared to backwards whirl. For example, FIG. 1B illustrates a borehole 10 with a drill bit 12 inside the borehole 10 experiencing forward synchronous rotation. The drill bit 12 is rotating about its axis 13 in a clockwise direction 16 and the drill bit 12 as a whole is also rotating about an axis 11 of the borehole 10 in a clockwise direction. Drill bits may be designed to encourage such forward synchronous rotation to avoid or reduce damage and wear. In addition, it may be desirable to cause the angular velocity of forward synchronous rotation to be, on average, about the same velocity as the rotation of the drill bit and drill string as a whole, although instantaneous velocities may deviate from one another slightly.

One technique to control bit whirl and reduce bit wear and damage is to design the drill bit to experience a net imbalance force (when in operation), or, in other words, a force in a direction that encourages forward synchronous rotation. The magnitude of the imbalance force may be designed to be within a target range of a percentage of the WOB. So-called "high-imbalance" bits or "gun drill bits" have been introduced that have a region devoid of cutters to push the drill bit in a desired direction and at a desired force during operation. High-imbalance design of drill bits may be achieved through selectively tailoring the location and size of the cutter devoid region, or otherwise selectively altering the imbalance force. For example, cutter rake angle, location or arrangement of cutters or abrasive particles, exposure of cutters (i.e., the distance a cutter cuts into the formation), size or orientation of blades on the drill bit, etc., may be altered to selectively alter the imbalance force.

DETAILED DESCRIPTION

The illustrations presented herein are not meant to be actual views of any particular material, apparatus, system, or method, but are merely idealized representations that are employed to describe certain embodiments of the present invention.

As used herein, the term "substantially" includes to a degree that one skilled in the art would understand the given parameter, property, or condition is met with a small degree of variance, such as within acceptable manufacturing tolerances.

As used herein, the phrase "earth-boring tool" includes an earth-boring drill bit, a drilling system (e.g., a drilling rig) including an earth-boring drill bit, and/or a component thereof.

As used herein, the phrase "drilling condition" means a hypothetical, predicted, or actual characteristic, feature, or condition of a drilling system (e.g., a drilling rig) and/or of a formation to be drilled. For example, "drilling conditions" based on drilling system characteristics, features, or conditions may be based on the capabilities or limitations of the drilling system to be used to drill the formation. By way of example, "drilling conditions" based on the drilling system may include values representing one or more of maximum torque, bit rotation speed (e.g., rotations per minute (RPM)), and weight-on-bit (WOB). By way of example, "drilling conditions" based on the formation to be drilled may include values representing one or more of a hardness of the formation to be drilled, an angle at which an earth-boring drill bit (referred to hereinafter as "drill bit") will proceed through a formation, bit offset from the borehole centerline, bit tilt, bit side load, and a type of formation to be drilled (including physical properties of the formation).

As used herein, the phrase "design variable" means a variable representing a characteristic, feature, or condition of a drill bit under design. "Design variable" includes a depth of cut (DOC) variable and other design variables. As used herein, "DOC variable" means a variable that represents a DOC of the drill bit under design. Values for the DOC variable may be expressed in terms of a distance that the drill bit under design travels into a formation with each revolution of the drill bit. As used herein, the phrase "other design variables" means a plurality of variables other than the DOC variable that represent, by way of example, one or more of cutter size, cutter shape, cutter placement, cutter rake angle, cutter composition, number of cutters, cutter chamfer configuration, number of blades, size of blades, blade angle, blade spacing, bit profile, cone angle, bit composition, junk slot area, wear state, and hydraulics (e.g., nozzle size, number of nozzles, location of nozzles, etc.). One or more values of the other design variables may be adjusted during the design of the drill bit to enhance (e.g., improve, optimize) one or more performance parameters of the drill bit, as will be explained in more detail below.

As used herein, the phrase "performance parameter" means a value to be calculated and/or enhanced in the design of a drill bit based on drilling conditions and design variables. "Performance parameters" may include dynamic parameters of a drilling system or drill bit. By way of example, "performance parameters" may include one or more of force, imbalance force, dynamic stability, rate of penetration (ROP), area of cut, torque, torque curves, volume of rock removed by cutters and/or blades, and work rate curves. In addition or alternatively, "performance parameters" may include a so-called "Joe Kelly" number described in more detail in U.S. Pat. No. 3,491,844 to Kelly, Jr. issued Jan. 27, 1970, the disclosure of which is incorporated herein in its entirety by this reference.

Figure 2:
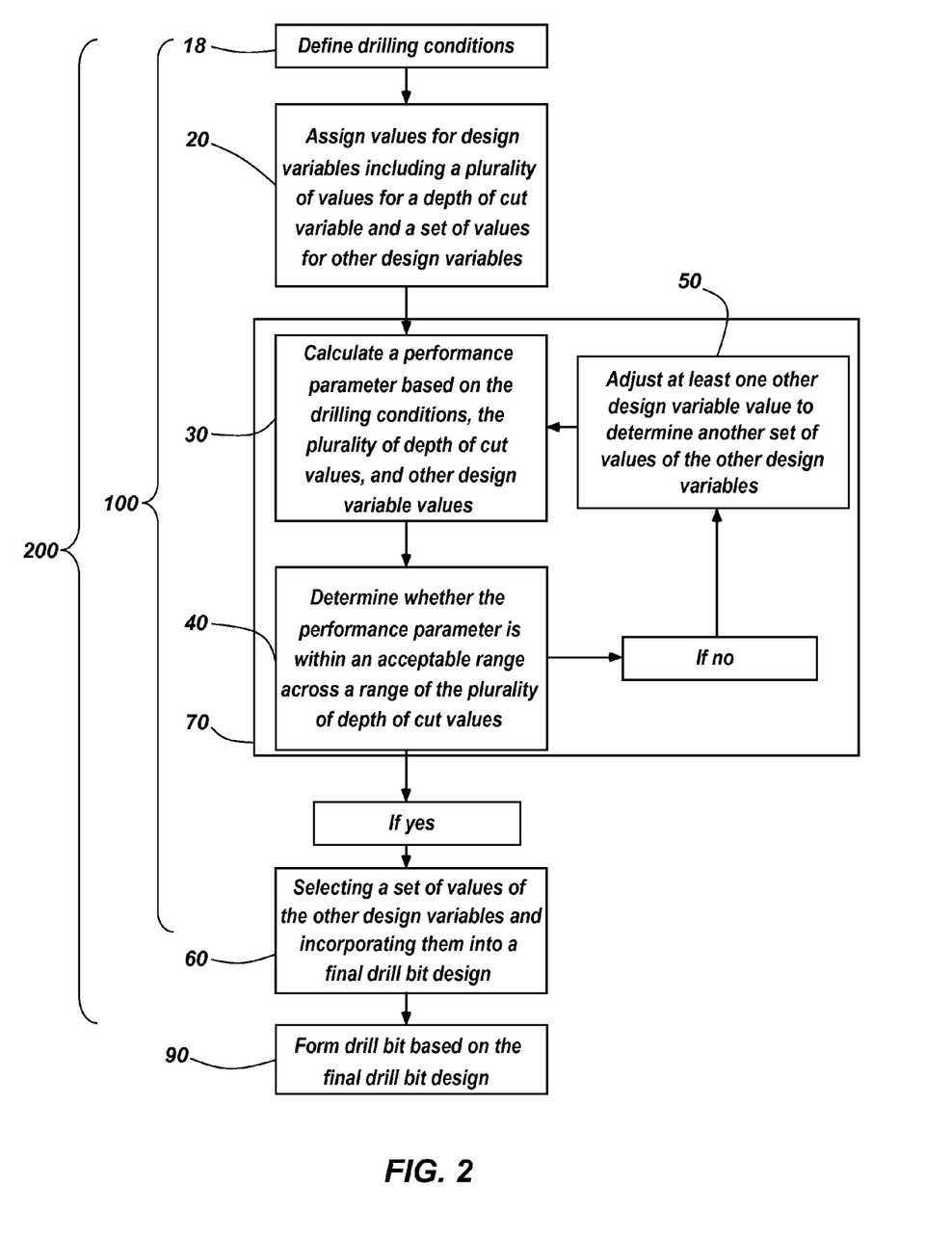
FIG. 2 is a flowchart showing methods of designing and forming an earth-boring drill bit according to embodiments of this disclosure.

A method 100 of designing an earth-boring tool according to at least one embodiment of the disclosure is illustrated with a flowchart in FIG. 2. The method 100 may be at least partially implemented with a computer. For example, the method 100 may be at least partially implemented with the assistance of a drilling simulation program on a computer. Such drilling simulation programs are known in the art and discussed, for example, in Hanson, J. M. and Hansen W. R., 1995, "Dynamics Modeling of PDC Bits," 1995 SPE/IADC Drilling Conference, Amsterdam, and Dykstra et al. "Improving Drilling Performance by Applying Advanced Dynamics Models," 2001 SPE/IADC Drilling Conference, Amsterdam, each of which is incorporated herein in its entirety by this reference. The method 100 may include defining drilling conditions, illustrated as operation 18. The method 100 may also include assigning values for design variables, illustrated as operation 20. By way of example, assigning values for the design variables may include assigning a plurality of values for a DOC variable and assigning a set of values for other design variables (i.e., one value for each of the other design variables). The values may be based on experience (e.g., based on previously known drill bits used for drilling similar formations), intuition, and/or general rules of thumb, or the values may be chosen arbitrarily, as will be appreciated by one skilled in the art.

The method 100 may further include calculating one or more performance parameters based on the drilling conditions, the plurality of DOC values, and the other design variable values, illustrated as operation 30. The one or more performance parameters calculated may include, by way of example, one or more of a force, an imbalance force, a dynamic stability, an ROP, an area of cut, a torque, a torque curve, and a "Joe Kelly" number. The one or more performance parameters calculated may be chosen by one skilled in the art seeking to enhance (e.g., improve, optimize) the one or more performance parameters of the drill bit under design.

The operation 30 of calculating one or more performance parameters may be implemented with the assistance of a computer. For example, the calculating may be implemented with the assistance of a drilling simulation program on a computer. The calculating may include providing a result of the calculation as one or more of a list of numbers, a graph, a figure, a color, data points, etc., representing the value(s) of the one or more performance parameters at a plurality of DOC values (e.g., as a function of DOC, as a plurality of numbers each associated with each DOC of the plurality, as a plurality of lines on a graph each representing a DOC, etc.) of the drill bit under design. In some embodiments, the results of the calculation may be kept in computer memory for further computer analysis, comparison, calculation, etc.

The method 100 of designing an earth-boring tool may further include determining whether the one or more performance parameters is within an acceptable range across a range of the plurality of DOC values, as illustrated in FIG. 2 by operation 40. As used herein, the phrase "within an acceptable range" includes within a range defined by at least one of a user of the method 100 (e.g., based on experience, target values of the one or more performance parameters, etc.) and tolerances and/or capabilities of a drilling system that will use the drill bit under design. The acceptable range or target values may be arbitrarily defined (e.g., selected, assigned). The acceptable range may be based on a balance between a plurality of factors including, by way of example, one or more of: target values; limitations, such as manufacturing feasibility, capabilities of a drilling system, cost, and restrictions imposed by other design variables; and the values of one or more other performance parameters different than the one or more performance parameters under review.

If the one or more performance parameters is within an acceptable range across a range of the plurality of DOC values, then optionally the set of values of the other design variables may, without further enhancement (described in more detail below), be output as a final drill bit design, illustrated as operation 60. The operation of outputting the final drill bit design may, in some embodiments, be inherently included in other operations of the method 100. In other words, after determining whether the one or more performance parameters is within an acceptable range, the user may note, select, and/or use the set of values of the other design variables that was used in the calculation of operation 30 as the final drill bit design without a separate operation of outputting the final drill bit design.

If, on the other hand, the one or more performance parameters is not within an acceptable range across a range of the plurality of DOC values, then at least one other design variable value may be adjusted to determine another set of values of the other design variables, as illustrated by operation 50. The another set of values of the other design variables may be different than the set of values of the other design variables determined in operation 20 by the difference of one or more of the values of the other design variables. The operation 30 of calculating the one or more performance parameters may be repeated based on the drilling conditions, the plurality of DOC values, and the another set of values of the other design variables determined by operation 50. The method 100 may continue by determining 40 whether the one or more performance parameters calculated based on the another set of values of the other design variables is within an acceptable range across a range of DOC values. If so, the another set of values of the other design variables may be output 60 as the final drill bit design.

The operations 30, 40, and optionally 50 of calculating one or more performance parameters, determining whether the one or more performance parameters is within an acceptable range, and optionally adjusting the value of at least one other design variable may be repeated as many times as necessary, practical, or desired to determine a set of design variables yielding improved (e.g., acceptable) values for the one or more performance parameters across a range of the plurality of DOC values. Such operations 30, 40, and optionally 50 may be referred to collectively as enhancing (e.g., improving, optimizing) the one or more performance parameters, illustrated as operation 70. Enhancing 70 may be repeated as many times as necessary, practical, or desired to reach improved (e.g., acceptable) values of the one or more performance parameters across a range of the plurality of DOC values.

In some embodiments, the operation 40 of determining whether the one or more performance parameters is within the acceptable range across a range of the plurality of DOC values may be replaced by comparing the one or more performance parameters based on two or more sets of design variables and selecting one of the two or more sets of values of other design variables in consideration of the comparison. Selecting may include determining whether the one or more performance parameters calculated based on the first set or on the second set is relatively closer to a target value across a range of the DOC values. In such embodiments, the method of designing a drill bit may include calculating one or more performance parameters based at least partially on the plurality of DOC values and a first set of other design variable values, adjusting the value of at least one of the other design variables to determine a second set of design variable values, and calculating the one or more performance parameters based at least partially on the plurality of DOC values and the second set of other design variable values. The one or more performance parameters based on the first set of design variable values may be compared with the one or more performance parameters based on the second set of design variable values. This comparison may be used to determine whether the first or second set of other design variable values yields a calculated one or more performance parameters closest to a target range or value across a range of DOC values of the bit under design. In other words, the one or more performance parameters may be compared to determine which of the first set of other design variable values and the second set of other design variable values yields improved performance compared to the other. Thus, rather than determining whether a single set of values of the other design variables is acceptable based on a target range or value of one or more performance parameters, two or more sets of values of other design variables may be compared to determine which has an improved performance parameter relative to the one or more other sets of design variable values. The set that produces the one or more performance parameters closest to the target range or value across a range of DOC values may be selected and/or output as a final drill bit design.

Figure 3:
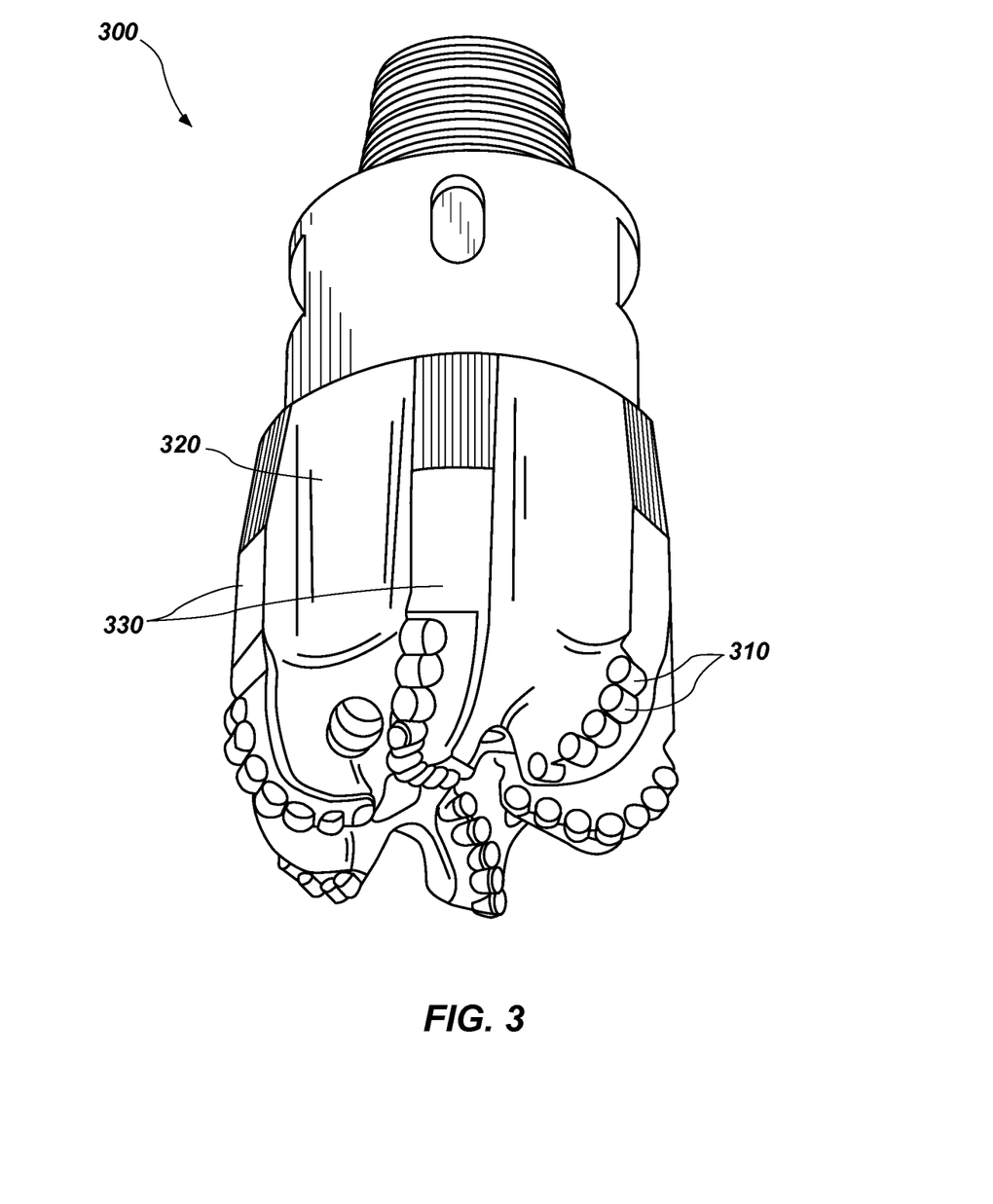
FIG. 3 is a perspective view of a drill bit formed according to an embodiment of this disclosure.

The disclosure also includes methods of forming an earth-boring tool. For example, a method 200 of forming an earth-boring tool may include the method 100 of designing the earth-boring tool of FIG. 2. According to at least one embodiment, the method 200 of forming an earth-boring tool may further include forming a drill bit (illustrated as operation 90) based on the final drill bit design output from the operation 60 of the method 100 of designing the earth-boring tool. Forming a drill bit based on the final drill bit design may include forming a drill bit with qualities (e.g., features, characteristics) that are at least substantially based on the values of the other design variables of the final drill bit design. By way of non-limiting example, the method 200 of forming an earth-boring tool may be used to form a drill bit 300 based on the output final drill bit design, as illustrated in FIG. 3. The drill bit 300 may have features based on the values of the other design variables of the final drill bit design. For example, features of the drill bit 300 based on the final drill bit design may include: the number, placement, orientation, and/or type of cutters 310; the length of a space 320 between adjacent blades 330; the number and/or shape of blades 330; or features based on any of the other design variables previously mentioned herein.

The disclosure is not limited to the particular flow or sequence of operations as has been described and illustrated in FIG. 2. In other words, one or more of the operations may be performed at a different time relative to other operations than has been particularly described and illustrated with reference to FIG. 2.

Figure 4:
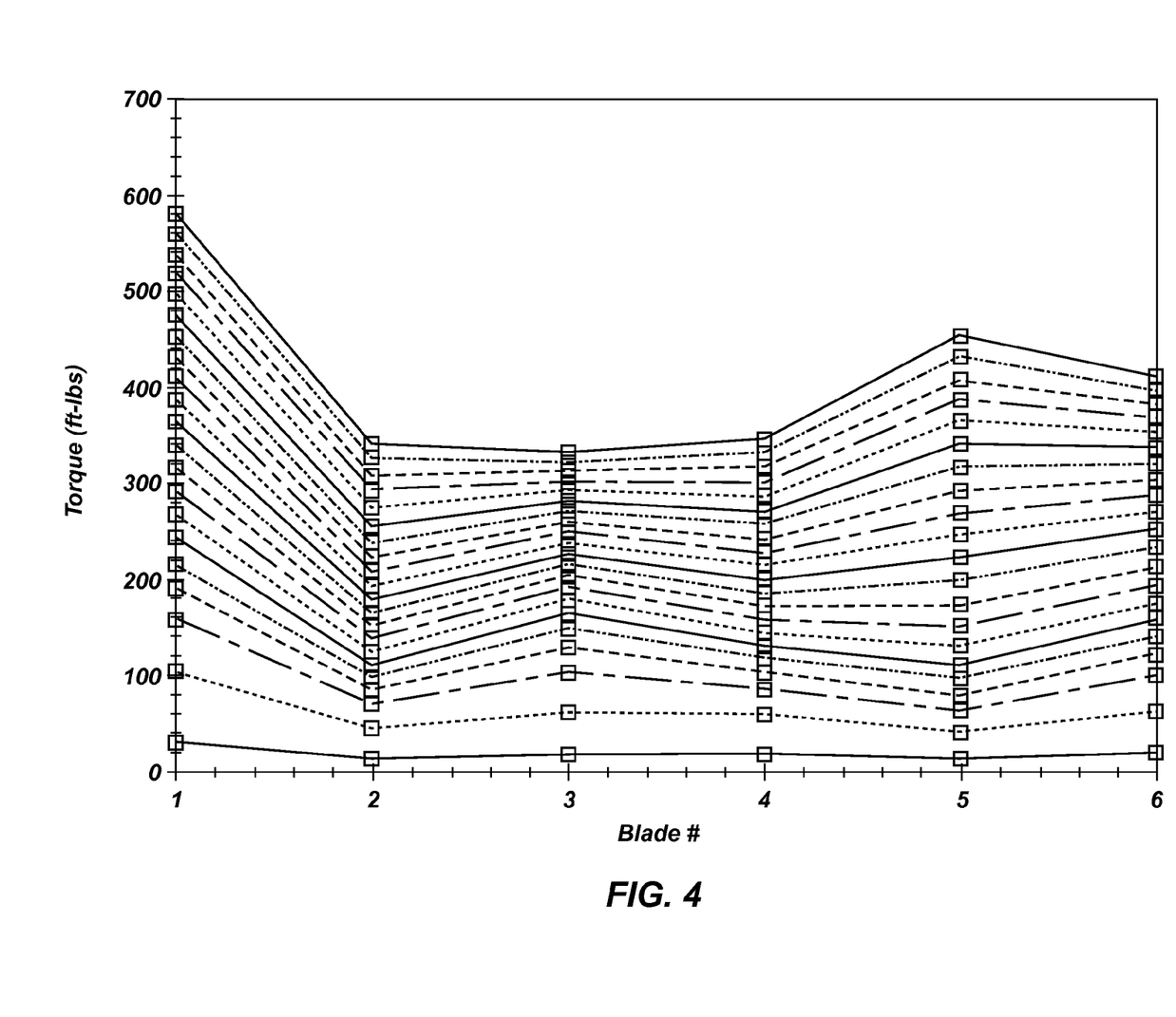
FIG. 4 is a graph showing the calculated torque curves of a first set of design variable values at a plurality of depths of cut of an earth-boring drill bit according to an embodiment of this disclosure.
Figure 5:
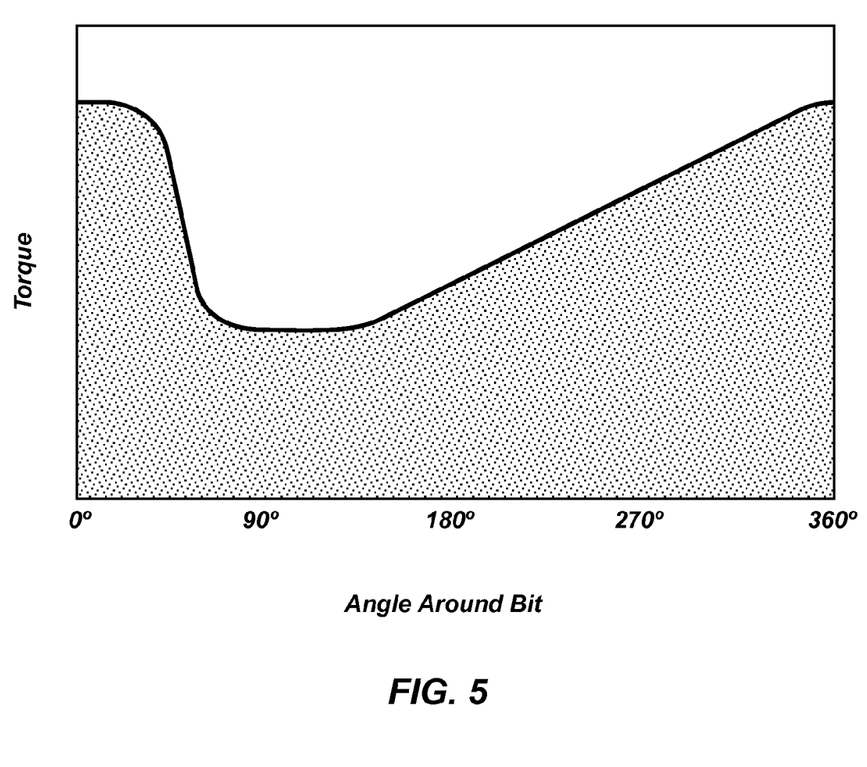
FIG. 5 is a graph illustrating a target torque curve used in designing an earth-boring drill bit according to an embodiment of this disclosure.
Figure 6:
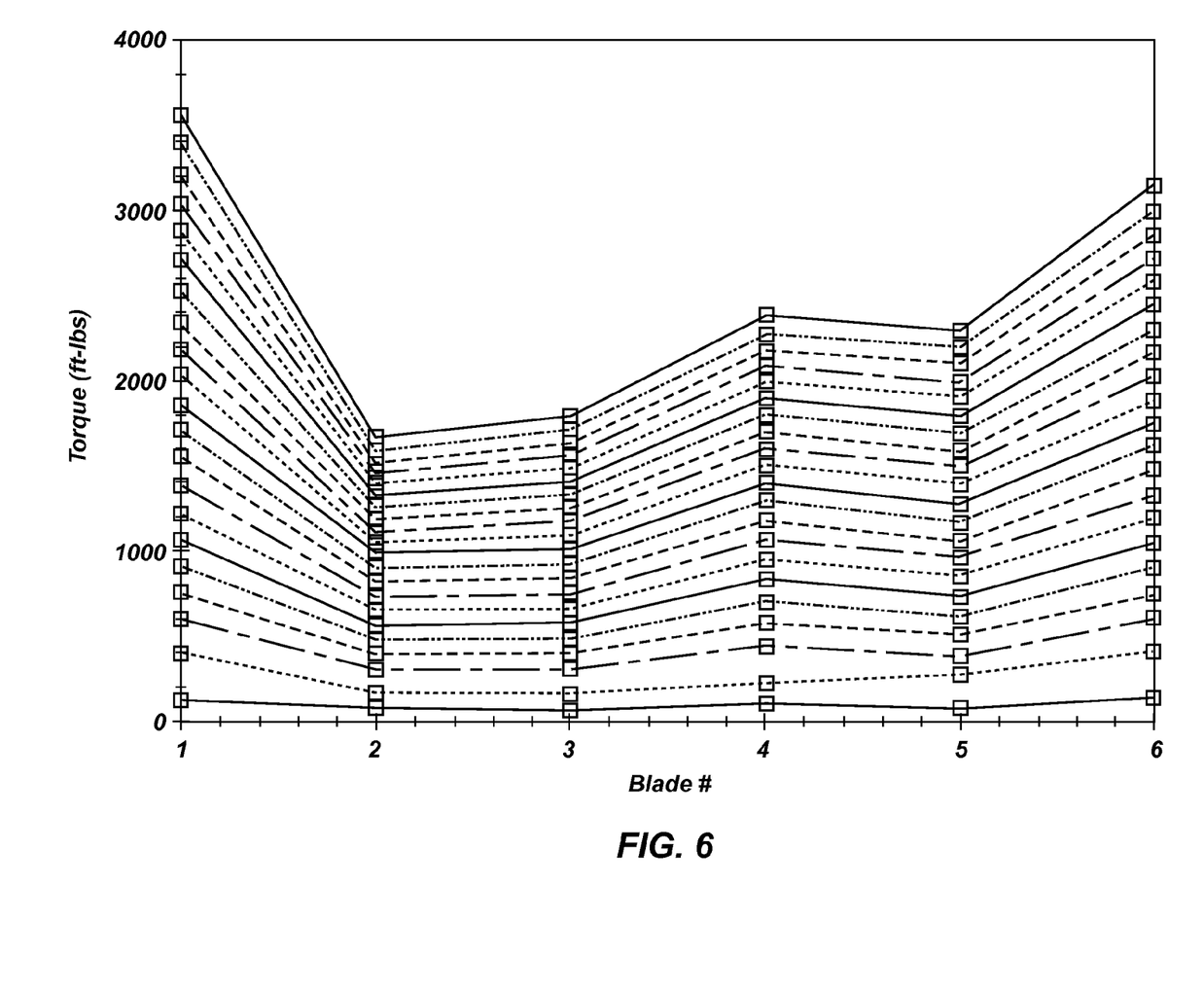
FIG. 6 is a graph showing the calculated torque curves of a second set of design variable values at a plurality of depths of cut of an earth-boring drill bit according to an embodiment of this disclosure.

An embodiment of a method of designing an earth-boring tool including enhancing a particular performance parameter (e.g., a dynamic parameter) is illustrated in FIGS. 4 through 6. Methods of designing an earth-boring tool may include enhancing a dynamic parameter of a drill bit such that the dynamic parameter falls within an acceptable range or is closer to a target value. By way of example, the dynamic parameter may be a torque curve representing torque values that the drill bit under design may experience under certain design conditions. The torque curve may be expressed as a set of calculated torque values at several locations (e.g., blades) around the drill bit connected with lines, as shown in FIG. 4. In operation, each blade on a drill bit may experience a torque due to the engagement of its cutters with the formation. A calculated torque curve includes a calculated torque that each blade is expected to experience under the defined drilling conditions and according to a particular set of other design variable values. A line may be used to connect the calculated torques of each neighboring blade to form a torque curve. A target torque curve (e.g., an acceptable range of the torque curves, an optimal torque curve) may be a torque curve that encourages the drill bit to experience forward synchronous rotation when drilling a formation to avoid or minimize damage and wear to the drill bit, although the disclosure is not so limited.

Drilling conditions may be defined, a plurality of values may be assigned for a DOC variable, and a first set of values may be assigned for other design variables, essentially as described above with reference to the operations 18 and 20 of FIG. 2. By way of non-limiting example and as shown in FIG. 4, the drilling conditions and the first set of design variables may be used to calculate torque curves of a drill bit under design at a plurality of DOC values of the drill bit under design. Such calculation may be performed with the assistance of a drilling simulation program on a computer. For example and referring to FIG. 4, a torque may be calculated for each of six blades and may be plotted with a separate line for each DOC value. Due to varying values of the other design variables (e.g., geometries, profile, cutter type and placement, etc.) of each blade, the torque on each blade may be different for a particular DOC value compared to other blades. The torque curve at each of the plurality of DOC values may be plotted on a graph to show an approximation of the torque curve as a function of the DOC. The lines that appear lower on the graph of FIG. 4 were calculated based on a lower DOC value, and those that appear higher were calculated based on a higher DOC value. The drilling conditions and the first set of values of the other design variables were held constant in producing the plurality of torque curves of FIG. 4. In other words, the method may include calculating a performance parameter at a plurality of DOC values while holding the values of the other design variables constant.

Although reference is made to a graph, the disclosure includes other expressions of data such as a list of numbers, a figure, a color, data points, storing data in computer memory, etc., representing the imbalance force at a plurality of DOC values (e.g., as a function of DOC) of the bit under design. In other words, any expression of data that allows a computer or user to determine whether the performance parameter (e.g., torque curve) is within an acceptable range may be used in embodiments of this disclosure. Furthermore, FIG. 4 shows twenty-one torque curves each based on a different DOC value. However, the methods of this disclosure are not limited to the particular number of DOC values shown herein. Any number of DOC values may be used in the calculation of a performance parameter to enhance the performance parameter.

Referring again to FIG. 4, the graph may be analyzed to determine whether the torque curves are within an acceptable range across a range of the DOC values. Such analysis may be performed in consideration of (e.g., comparing the torque curves with) a target torque curve. By way of non-limiting example, a target torque curve is shown in FIG. 5. The target torque curve may represent a relative distribution of torque around a drill bit that the drill bit may experience when in operation. In the embodiment of FIG. 5, the target torque curve starts (e.g., at 0° around the drill bit, at the first blade) with a relatively high torque, drops off relatively abruptly to a lower torque, and then relatively gradually increases to the relatively high torque. The calculated torque curves (FIG. 4) may be compared with the target torque curve (FIG. 5) to determine whether the first set of values of the other design variables yields acceptable torque curves across a range of the DOC values.

In comparing the calculated torque curves with the target torque curve, it is noted that blade 6 experiences a higher calculated torque than blade 5 for the lower DOC values, which is desirable based on the target torque curve. However, for the higher DOC values, blade 6 experiences a lower calculated torque than blade 5, which is less desirable based on the target torque curve. For some of the higher DOC values, blade 4 generally has a higher calculated torque than blade 3, which is desirable based on the target torque curve. For some of the lower DOC values, blade 4 generally has a lower calculated torque than blade 3, which is less desirable based on the target torque curve. Thus, while the relative calculated torques of blades 5 and 6 are desirable at a range of lower DOC values, the relative calculated torques of blades 3 and 4 are less desirable over some of that range of lower DOC values. Conversely, while the calculated torques of blades 5 and 6 are less desirable at a range of higher DOC values, the calculated torques of blades 3 and 4 are desirable over some of that range of higher DOC values. Thus, analyzing the calculated torque curves across a range of DOC values shows that the first set of values of the other design variables yields torque curves that may not be acceptable over a wide range of the DOC values that the drill bit may experience in operation.

After having determined that the calculated torque curves based on the first set of values of the other design variables is not within an acceptable range over a range of the DOC values, the value of one or more of the other design variables may be adjusted to determine a second set of values of the design variables. By way of non-limiting example, the location, existence, exposure, and/or number of backup cutters may be adjusted. The backup cutters may have an especially high correlation to drill bit performance over a range of DOC values because the backup cutters may engage with the formation to be drilled at different DOC values than the primary cutters and/or than other backup cutters. After adjusting the one or more values of the other design variables, the torque curves may be calculated based at least partially on the plurality of DOC values and the second set of values of the design variables of the drill bit under design, resulting in FIG. 6, for example.

As can be seen in FIG. 6, the torque curves based on the second set of design variables may be closer to the target torque curves (FIG. 5) than the torque curves based on the first set of design variables (FIG. 4) across a range of the plurality of DOC values. For example, the calculated torque values of blade 6 are higher than the calculated torque values of blade 5 at each DOC value of the plurality in FIG. 6. Furthermore, the calculated torque values of blade 4 are higher than the calculated torque values of blade 3 at each DOC value of the plurality in FIG. 6. Although the torque values of blade 5 are lower than the torque values of blade 4 for most of the DOC values of the plurality, they are only relatively slightly lower. The general trend of each line (based on each DOC value) based on the second set of values of the other design variables (FIG. 6) is more like the target torque curve (FIG. 5) than the general trend of each line based on the first set of values of the other design variables (FIG. 4). Therefore, the second set of values of the other design variables may be acceptable while the first set of design variables may not be acceptable. Stated another way, the second set of values of the other design variables may lead to enhanced (e.g., improved, optimized) torque curves when compared to the first set of values of the other design variables. The second set of values of the other design variables may then be selected or output as a final drill bit design, as described above with reference to operation 60 of FIG. 2.

Alternatively, further enhancement (not shown) may be performed in an attempt to find a new set of values of the other design variables that leads to calculated torque curves that are even closer to a target torque curve across a range of DOC values than that shown in FIG. 6. A method essentially the same as that described above with reference to FIGS. 4 through 6 may be used to compare the calculated torque curves of the second set of values of the other design variables to the calculated torque curves of the new set of values of the other design variables. In other words, the method described with reference to FIGS. 4 through 6 may be repeated as many times as necessary, desired, and/or practical to determine the set of values of other design variables that leads to acceptable and/or enhanced torque curves, as will be understood by one skilled in the art.

The methods described in this disclosure may offer advantages over prior known methods. Some prior known methods of designing a drill bit include calculating a performance parameter while assuming the drill bit under design operates at a single, target DOC. In reality, an operating drill bit may cut through a formation at different rates (and therefore different DOC values) over the life of the drill bit for a variety of reasons. For example, the DOC may change because properties (e.g., hardness, material type) of the formation may change as different depths are reached by the drill bit, drilling conditions (e.g., RPM, WOB) may vary during drilling, and/or drill bit conditions (e.g., cutter wear) may change as a result of drilling. Therefore, the methods of this disclosure may approximate actual drilling better than prior known methods.

Methods of this disclosure may also be used to predict an optimal DOC for a particular drill bit design. For example, a method of designing a drill bit that includes calculating torque curves at a plurality of DOC values may show which DOC value is closest to a target torque curve. A drill bit formed based on the design variable values may then be operated at a particular DOC to help maintain the torque curve at or near target values.

The methods of this disclosure may produce a more favorable drill bit design for operation at a range of DOC values when compared with prior known methods. For example, a calculated torque curve assuming a single, particular DOC may be close to a target torque curve. Prior known methods of bit design may have found such a calculated torque curve to be satisfactory and stopped further enhancement of the torque curve. However, using an embodiment of this disclosure by calculating the torque curve at a plurality of DOC values may show that the torque curves at other DOC values for the same drill bit design are not acceptable. In other words, calculating the torque curves based on a first set of values of other design variables at a plurality of DOC values may indicate that the values of the other design variables of the first set may need to be adjusted to maintain the torque curves closer to a target torque curve, even though the calculated torque curve at a particular DOC may be close to the target torque curve.

Therefore, the methods of this disclosure may be more efficient, cost-effective, and/or accurate than prior known methods. Furthermore, the methods of this disclosure may be used to design an earth-boring tool that has a longer usable life and better performance than prior known methods.

Embodiments of the present invention, therefore, may find use in any application in which a performance parameter of an earth-boring tool may be optimized. Specifically, embodiments of this disclosure may be used to design any earth-boring tool, such as a roller cone drill bit (e.g., a tri-cone bit), an impregnated (e.g., diamond impregnated, cubic boron nitride impregnated) drill bit, a fixed-cutter bit, a hybrid bit, a core bit, or any other earth-boring tool known to those skilled in the art. Furthermore, embodiments of this disclosure may be used in the enhancement of any performance parameter of an earth-boring tool, such as, for example, an imbalance force, a torque, a torque curve, dynamic stability, an ROP, an area of cut, a "Joe Kelly" number, or any other of the performance parameters previously mentioned herein.

While the present invention has been described herein with respect to certain embodiments, those skilled in the art will recognize and appreciate that it is not so limited. Rather, many additions, deletions, and modifications to the embodiments depicted and described herein may be made without departing from the scope of the invention as hereinafter claimed, and legal equivalents of the invention. In addition, features from one embodiment may be combined with features of another embodiment while still being encompassed within the scope of the invention as contemplated by the inventor. Furthermore, the invention has utility in conjunction with earth-boring drill bits having different bit profiles as well as different cutter types.

What is claimed is:

1. A method of designing an earth-boring tool, comprising:
    using a computer to calculate one or more performance parameters of an earth-boring drill bit comprising a torque value for each blade of a plurality of blades of the earth-boring drill bit as a function of drilling conditions, a plurality of values of a depth of cut variable, and a first set of values of other design variables for the earth-boring drill bit;
    using a computer to generate a plot that includes a plurality of torque curves, each torque curve being a line extending through the calculated torque value for each neighboring blade as a function of a value of the depth of cut variable of the plurality of values of the depth of cut variable; and
    comparing each of the plurality of torque curves with a target torque curve.

2. The method of claim 1, further comprising adjusting the value of at least one other design variable of the first set of values to determine a second set of values of the other design variables different than the first set of values.

3. The method of claim 2, further comprising calculating the one or more performance parameters of the earth-boring drill bit as a function of the drilling conditions, the plurality of values of the depth of cut variable, and the second set of values of the other design variables.

4. The method of claim 1, further comprising determining whether the one or more performance parameters is within an acceptable range across a range of the plurality of values of the depth of cut variable.

5. The method of claim 1, wherein using a computer to calculate one or more performance parameters further comprises calculating one or more of a force, an imbalance force, a dynamic stability, a rate of penetration, an area of cut, and a Joe Kelly number.

6. The method of claim 1, wherein using a computer to calculate one or more performance parameters is implemented using a drilling simulation program on the computer.

7. The method of claim 1, further comprising forming an earth-boring tool based on the calculated one or more performance parameters.

8. A method of enhancing a performance parameter in the design of an earth-boring tool, the method comprising:
    using a computer to calculate a performance parameter of an earth-boring drill bit under design, the performance parameter comprising a torque value for each blade of a plurality of blades of the earth-boring drill bit, as a function of a plurality of values of a depth of cut variable and a first set of values of other design variables of the drill bit under design;

using the computer to calculate the performance parameter as a function of a second set of values of the other design variables and the plurality of values of the depth of cut variable of the drill bit under design, the second set of values of the other design variables being different than the first set of values of the other design variables;

using the computer to generate a plot of a first torque curve extending through the torque value for each neighboring blade as a function of the first set of values of the other design variables;

using the computer to generate a plot of a second torque curve extending through the torque value for each neighboring blade as a function of the second set of values of the other design variables;

comparing the first torque curve with the second torque curve; and selecting one of the first and second sets of values of the other design variables in consideration of the comparison.

9. The method of claim 8, further comprising adjusting a value of at least one of the other design variables of the first set of values of the other design variables to determine the second set of values of the other design variables.

10. The method of claim 8, wherein selecting one of the first and second sets of values of the other design variables in consideration of the comparison comprises determining whether the first torque curve or the second torque curve is relatively closer to a target value across a range of the depth of cut values.

11. The method of claim 8, wherein comparing the first torque curve with the second torque curve comprises plotting the first torque curve and the second torque curve on a same graph as a function of the depth of cut variable.

12. The method of claim 11, further comprising comparing the first torque curve and the second torque curve with a target torque curve and selecting one of the first torque curve and second torque curve based on which of the first torque curve and second torque curve is closest to the target torque curve.

13. The method of claim 12, further comprising selecting a depth of cut value based on which of the first torque curve and second torque curve is closest to the target torque curve.

14. A method of forming an earth-boring tool, comprising:
designing an earth-boring tool, comprising:
using a computer to enhance a parameter torque curve of the earth-boring tool including using the computer to calculate a torque value for each blade as a function of a plurality of values of a depth of cut variable of the earth-boring tool and to generate a plot of torque curves each extending through the torque values for each neighborhood blade as a function of a value of the depth of cut variable of the plurality of values of the depth of cut variable; and
using the computer to output a design of the earth-boring tool based on the enhancement; and
forming the earth-boring tool based at least in part on the design.

15. The method of claim 14, wherein using the computer to output a design of the earth-boring tool based on the enhancement comprises using the computer to output a set of values of design variables used in the calculating of the torque value for each blade.

* * * * *